United States Patent [19]
Duley

[11] Patent Number: 5,561,389
[45] Date of Patent: Oct. 1, 1996

[54] CLOCK CONDITIONING CIRCUIT FOR MICROPROCESSOR APPLICATIONS

[75] Inventor: Raymond S. Duley, Buda, Tex.

[73] Assignee: Advanced Micro Devices, Inc., Sunnyvale, Calif.

[21] Appl. No.: 296,023

[22] Filed: Aug. 25, 1994

[51] Int. Cl.$^6$ .................................................. H03K 17/22
[52] U.S. Cl. .......................... 327/143; 327/142; 327/198; 327/310
[58] Field of Search ..................................... 327/530, 531, 327/537, 538, 540, 541, 544–548, 142–144, 153, 155, 158, 161, 178, 180, 198, 291, 293, 294, 298, 310

[56] References Cited

U.S. PATENT DOCUMENTS

| | | | |
|---|---|---|---|
| 4,234,920 | 11/1980 | Van Ness et al. | 327/143 |
| 4,518,865 | 5/1985 | Iwasaki | 327/198 |
| 4,520,418 | 5/1985 | Susi | 327/143 |
| 4,614,880 | 9/1986 | Go et al. | 327/143 |
| 4,886,983 | 12/1989 | Taka | 327/142 |
| 5,166,546 | 11/1992 | Savignac et al. | 327/143 |
| 5,386,152 | 1/1995 | Naraki | 327/143 |
| 5,414,307 | 5/1995 | Brandmaier | 327/198 |
| 5,416,363 | 5/1995 | Duesman | 327/142 |

FOREIGN PATENT DOCUMENTS

| | | | |
|---|---|---|---|
| 405218834 | 8/1993 | Japan | 327/143 |

OTHER PUBLICATIONS

Power on Reset Circuit Sensitive to Power Supply Level and Clock (RBM Technical Bulletin vol. 37 No. 02A Feb. 1994).
Singh, et al., "The 8086 Microprocessor and its Memory Interface", *16–Bit and 32–Bit Microprocessors*, (Prentice-Hall, Inc., 1991), pp. 120–122.

Primary Examiner—Timothy P. Callahan
Assistant Examiner—T. Lam
Attorney, Agent, or Firm—Kevin L. Daffer

[57] ABSTRACT

A microprocessor clocking system is provided for achieving attenuation of a clock signal sent to a microprocessor during initial activation of a connected power supply. By attenuating the clock signal during initial turn-on of the power supply, the clock input to the microprocessor is prevented from erroneous triggering and improper operation. After a delay period has expired, the clock signal is allowed to input directly to the microprocessor input. The delay period is determined as a time exceeding normal spurious noise conditions found on the power supply during initial activation. The microprocessor clocking system includes a clock conditioning circuit configured between a clock signal output of a core logic unit and the clock signal input to a microprocessor. The clock conditioning circuit utilizes a turn-on circuit and a delay circuit coupled to the power supply voltage. The turn-on circuit and delay circuit are both connected to an attenuator, and the attenuator functions to attenuate the clock signal during initial power supply activation.

19 Claims, 2 Drawing Sheets

5,561,389

CLOCK CONDITIONING CIRCUIT FOR MICROPROCESSOR APPLICATIONS

BACKGROUND OF THE INVENTION

1. Field of the Invention

This invention relates to a clock conditioning circuit and, more particularly, to a device and method for disconnecting initial clock pulses from a load unit and connecting subsequent clock pulses to the load unit.

2. Description of the Relevant Art

There is almost an infinite variety of load units. For operation, some load units require an input of clock pulses. The clock pulses perform many tasks, one of which is to synchronize operation of the load unit to that of possibly other connected load units. Thus, a popular load unit includes a microprocessor (or "CPU"). Current microprocessors operate at high speeds, often exceeding several hundred megahertz (MHz). Instructions, addresses and data are sent through the microprocessor at speeds synchronized with the input clock pulses.

A conventional way in which to form the clock pulses and connect those pulses to a microprocessor load is shown in the microprocessor clocking system 10 of FIG. 1. System 10 includes a high speed (e.g., several hundred MHz) crystal 12. Crystal 12 defines a relatively stable frequency of pulses sent to oscillator driver 14. Oscillator driver 14 outputs a fundamental crystal frequency, denoted as oscillator signal ("OSC"). The fundamental crystal frequency can be divided or further synchronized with a clock synchronizing signal ("CSYNC") to produce a microprocessor clocking signal denoted as CLK. Core logic 16 is used to perform all logical operations necessary to synchronize the fundamental crystal frequency of OSC signal and produce a clock signal CLK acceptable by microprocessor 20. A suitable description of conventional core logic 16 and the various logical operations contained therein, is described in Singh, et al., 16-*Bit and 32-Bit Microprocessors*, (Prentice-Hall, Inc., 1991), pp.120–122 (herein incorporated by reference).

As shown in FIG. 1, oscillator driver 14, core logic 16 and CPU 20 are activated upon receiving a positive voltage (i.e., power supply voltage) denoted as Vcc. The power supply voltage applied to oscillator driver 14 creates the oscillator signal and subsequently creates the clock signal input to CPU 20. Due to the somewhat large loading capacitance of oscillator driver 14, core logic 16 and especially CPU 20, the power supply voltage cannot instantly achieve full power (operational) levels. As shown in FIG. 2, power supply voltage ramps up to its operational or steady state value over a time duration from time $t_0$ to time $t_1$. After time $t_1$, depending upon capacitive loading, the power supply voltage may overshoot the steady state voltage value illustrative of an underdamped condition between times $t_1$ and $t_2$. Most manufacturers prefer a fast ramp-up time to allow quick turn on of a load device. However, during turn on, i.e., between times $t_0$ and $t_1$, sporadic clocking errors can occur. Further, after time $t_1$, as a penalty to quick turn on, underdamping often occurs. The sporadic clocking occurs as a result of noise during ramp on, and underdamping presents itself as a "ringing" of the power supply just prior to it achieving steady state value (i.e., steady state occurring after time $t_2$).

In order to minimize cost and maximize manufacturability, most manufacturers embody as much of the clocking system as possible on a single monolithic chip. Thus, oscillator driver 14, core logic 16, CPU 20, and power supply conductors, as well as clock signal conductors, are embodied upon a single monolithic substrate. The power supply conductor carrying power supply voltage is routed throughout the monolithic chip, oftentimes proximate to core logic 16 and the clocking signal conductors. Any noise caused by ramp-up of the power supply can present itself to adjacent conductors and cause problems in the operation of CPU 20. An illustrative example of this occurrence is shown in relation to FIGS. 2 and 3.

FIG. 3 illustrates the clock signal output from core logic 16 to CPU 20. The clock signal is shown during the time of initial power supply turn on, between times $t_0$ and $t_1$. The clocking signal operates in the megahertz (MHz) range with a time period generally less than 100 or 200 nanoseconds (ns). Numerous clock cycles can occur during the turn on period, causing inaccurate or indeterminate clocking transistions prior to the operational power supply voltage. After time $t_1$, the clock signals may reach operational levels, yet the high and low levels might "ring" at the transition edges as shown in FIG. 4. Indeterminate transitions and/or ringing of the clock signal during ramp-up and overshoot of the power supply prior to the supply achieving steady state causes inappropriate operation of CPU 20.

If the control clock contains transient noise spikes, those spikes can deleteriously affect initial operation of CPU 20. For example, many conventional CPUs utilize a phase-locked loop to receive the clock signal. The phase-locked loop functions to lock upon the incoming clock signal frequency using a voltage controlled oscillator and a feedback arrangement of common design. Other CPUs may use a one-shot of fixed duty cycle to receive the clock signal. The one-shot triggers upon the rising edge of the incoming clock signal and maintains an astable state for a fixed duration. In either instance, either a phase-locked loop configuration or a one-shot configuration, CPU 20 relies upon a well-defined transition edge of the incoming clock signal, and also relies on the clock signal maintaining a relatively constant or steady high and low voltage magnitude. If the transition edge or the high and low voltage magnitudes vary as a result of cross-talk between an underdamped power supply voltage and the clock signal, then the CPU internal clocking may falsely trigger and/or fail to lock upon the true clock frequency. Instead of operating at a constant, true clock-rate, CPU 20 may falsely transition to improper clock rates during initial ramp-up of the power supply voltage. It would therefore be highly desirable to ensure that CPU 20 does not experience spurious clock changes during initial ramp-up of the connected power supply. It would be further advantageous to achieve said clock conditioning without causing propagation delay of the clock signal between core logic 16 and CPU 20. Absent propagation delay, any changes at the output of core logic 16 will be immediately presented to CPU 20. It would still be further advantageous to perform clock conditioning with minimal power loss and with minimal component cost.

SUMMARY OF THE INVENTION

The problems outlined above are in large part solved by the clock conditioning circuit of the present invention. That is, the clock conditioning circuit hereof attenuates the clock signal during the initial ramp-up of the power supply voltage and during any overshoot period which might thereafter occur. After a defined delay, attenuation of the clock signal is discontinued. The delay period is set to exceed the ramp-up time and overshoot time associated with powering the power supply. Of further importance is placement of only passive devices within the clock signal path between the clock signal origination point and the load microprocessor. By avoiding active devices and their associated parasitic capacitances, the conditioning circuit hereof assures adaptability to any clock signal frequency. The clock conditioning circuit is thereby well adapted to high speed microprocessor applications.

Broadly speaking, the present invention contemplates a clock conditioning circuit. The clock conditioning circuit includes an attenuator having a selectable path connected between a clock signal and a ground potential. A turn-on circuit is connected between the attenuator and a positive voltage. Upon initial receipt of the positive voltage, the turn-on circuit is coupled to activate the selectable path. A delay circuit is connected between the attenuator and the positive voltage. After initial receipt of the positive voltage has expired, the delay circuit is coupled to deactivate the selectable path.

The selectable path comprises a path of variable resistance. The variable resistance is maximum during deactivation of the selectable path and is minimum during activation of the selectable path. The positive voltage initially comprises a transient voltage and subsequently comprises a steady state voltage. The transient voltage is coupled to the attenuator and the steady state voltage is routed from the attenuator to the delay circuit.

The present invention further contemplates a microprocessor clocking system. The microprocessor clocking system includes a core logic circuit and a microprocessor embodied upon a single monolithic silicon substrate and connected by a clock signal sent from the core logic circuit to the microprocessor. An attenuator, a turn-on circuit and a delay circuit are also embodied upon the single monolithic silicon substrate. The turn-on circuit is coupled to receive a power supply voltage and to send an initial duration of the power supply voltage to the attenuator and to further send a subsequent duration of the power supply voltage to the delay circuit. The attenuator is adapted, upon receipt of the initial power supply voltage, to attenuate the clock signal to a ground potential. A passive damping device is coupled between the core logic circuit and the microprocessor to receive the clock signal and damp the clock signal with no propagation delay as the clock signal is sent from the core logic to the microprocessor.

The attenuator preferably comprises an MOS transistor having a gate terminal, a drain terminal and a source terminal. The gate terminal is connected between the turn-on circuit and the delay circuit, the drain terminal is connected to the clock signal, and the source terminal is connected to the ground potential. The source and drain terminals form a conductive path when activated by the turn-on circuit. The turn-on circuit activates the conductive path during the initial duration of the power supply voltage. The turn-on circuit preferably comprises a capacitor connected in a high frequency pass configuration, and the capacitor is connected in parallel with a resistor between the power supply voltage and the attenuator as well as between the power supply voltage and the delay circuit. The capacitor presents a low impedance, high frequency response network with the resistor providing a dc voltage pass to the attenuator. The delay circuit comprises a resistor and a capacitor connected in series in a low frequency pass configuration between the power supply voltage and the ground potential. The delay circuit further comprises a series-connected pair of diodes coupled between a base terminal of a bipolar transistor and an intermediate location between the resistor and the capacitor of the low-pass arrangement.

The present invention still further contemplates a method for disconnecting (defined herein as "attenuating") a clock signal to a microprocessor only during initial activation of the power supply voltage used to form the clock signal. The method comprises the steps of generating a clock signal from a core logic circuit during an initial period during which a power supply is first applied to the core logic circuit. Next, the clock signal is intercepted during the initial period and routed to a ground potential. The clock signal is further generated from the core logic circuit during a subsequent period after which the initial period has expired. The clock signal is forwarded during the subsequent period to a microprocessor. The step of intercepting the clock signal during an initial period and routing the clock signal to a ground potential comprises a further step of activating a conductive path between the clock signal and the ground potential. The step of forwarding the clock signal during the subsequent period to a microprocessor further comprises the step of deactivating the conductive path between the clock signal and the ground potential.

BRIEF DESCRIPTION OF DRAWINGS

Other objects and advantages of the invention will become apparent upon reading the following detailed description and upon reference to accompanying drawings in which.

Figure 1:
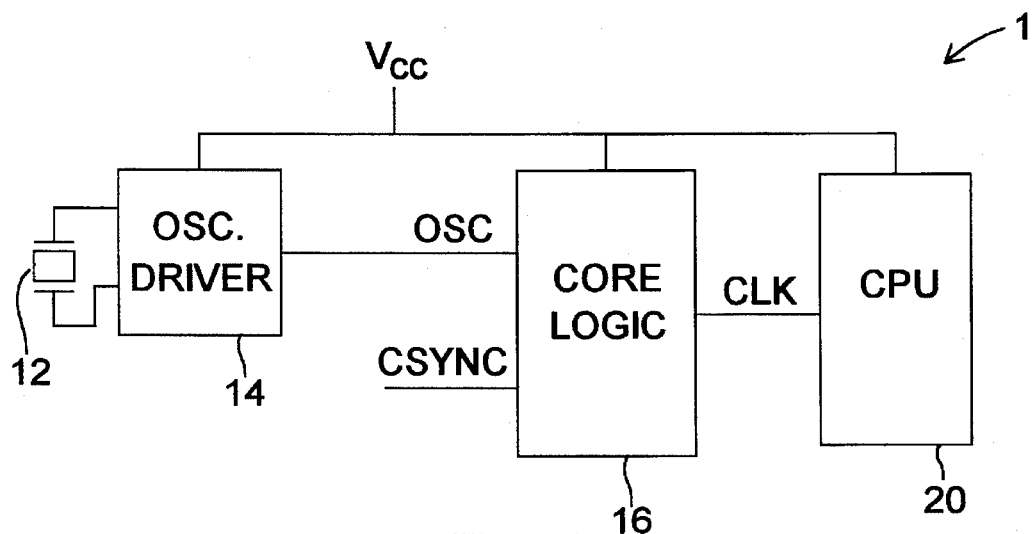
FIG. 1 is a block diagram of a clocking system according to an exemplary prior art design.
Figure 2:
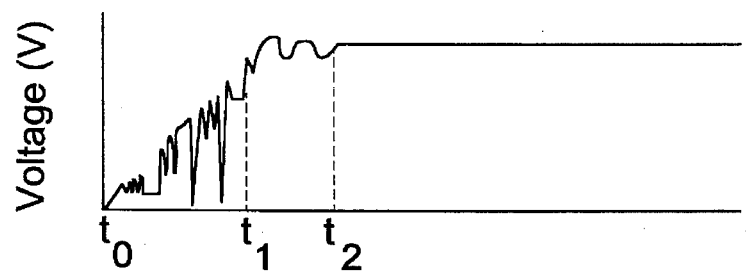
FIG. 2 is a timing diagram of voltage versus time of a power supply voltage (Vcc)
Figure 3:
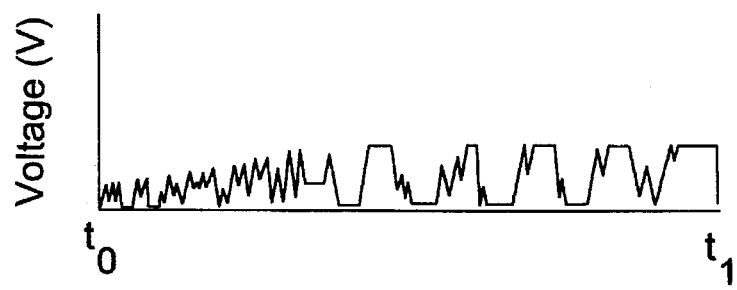
FIG. 3 is a timing diagram of voltage versus time of a clock signal generated from the clocking system between times $t_0$ and $t_1$ according to the exemplary prior art design.
Figure 4:
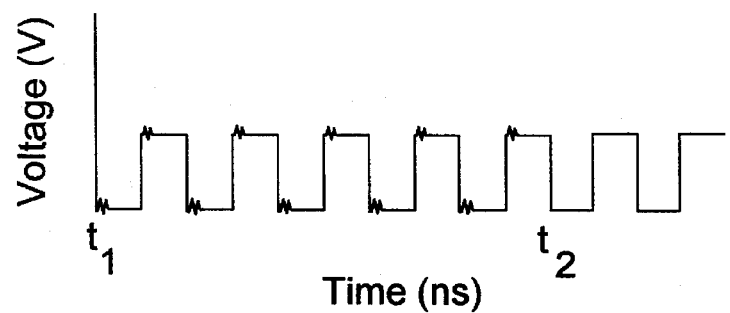
FIG. 4 is a timing diagram of voltage versus time of a clock signal generated from the clocking system between times $t_1$ and $t_2$ according to the exemplary prior art design.

While the invention is susceptible the various modifications and alternative forms, specific embodiments thereof are shown by way of example in the drawings and will herein be described in detail. It should be understood, however, that the drawings and description thereto are not intended to limit the invention of the particular forms disclosed, but on the contrary, the intention is to cover all modifications, equivalents, and alternatives falling within the spirit and scope of the present invention as defined by the appended claims.

DETAILED DESCRIPTION OF THE INVENTION

Figure 5:
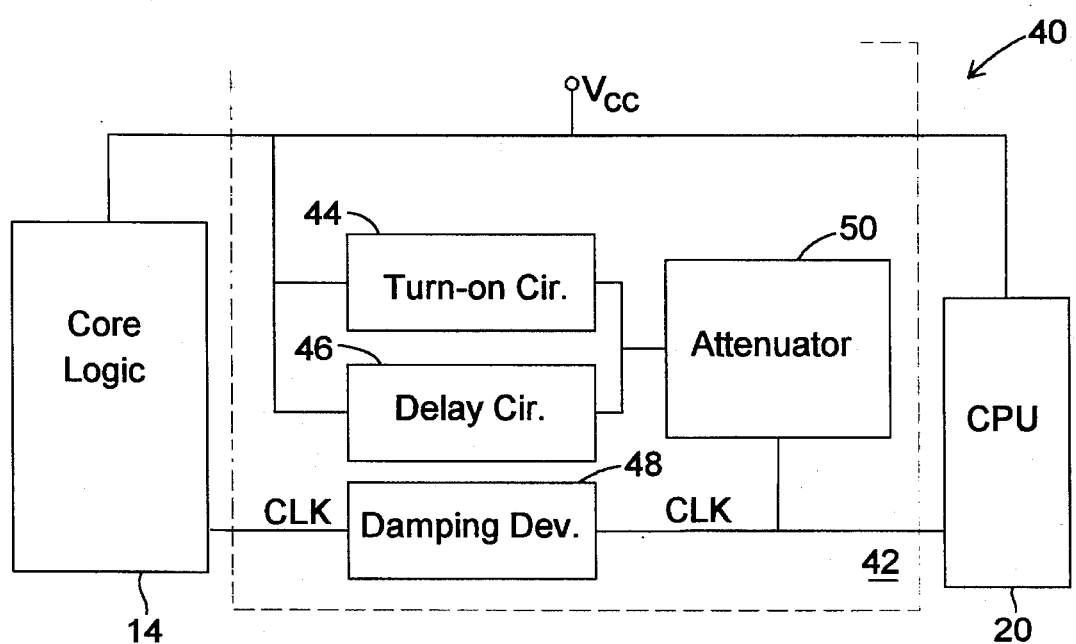
FIG. 5 is a microprocessor clocking system of the present invention.

Turning now to FIG. 5, a microprocessor clocking system 40 of the present invention is shown. System 40 includes core logic 14 and microprocessor (CPU) 20. Core logic 14 and operation thereof, is described in reference to FIG. 1. CPU 20 operates according to a time base synchronized with a clock signal (CLK) input. Core logic 14, CPU 20 (as well as circuit 42 described hereinbelow) begin operation when the power supply (Vcc) receives an operational voltage level.

Placed between core logic 14 and CPU 20 is a clock conditioning circuit 42. Clock conditioning circuit 42 is used to attenuate the clock signal during initial turn-on of the power supply. After the power supply achieves approximately 2 volts and after a delay (i.e., steady state, subsequent to initial ramp up and associated overshoot), circuit 42 then discontinues attenuation and allows the clock signal direct input into CPU 20. Accordingly, clock conditioning circuit 42 conditions the clock signal in order for the phase-locked loop or one-shot within CPU 20 to properly function. Clock conditioning circuit 42 thereby prevents false triggering of CPU 20 during initial turn-on of the power supply and after a delay, thereby preventing spurious errors or false triggers from occurring.

Clock conditioning circuit 42 generally includes power supply conductors connected between the power supply and the turn-on circuit 44 as well as delay circuit 46. A clock signal conductor is connected between core logic 14 and CPU 20, and a damping device 48 is interposed within the clock signal conductor. Turn-on circuit 44 and delay circuit 46 are connected with one another, and each are connected to an attenuator 50. Attenuator 50 receives an activation signal from turn-on circuit 44, or a deactivation signal from delay circuit 46. During activation, attenuator 50 attenuates the clock signal output from damping device 48. Upon deactivation, attenuator 50 ceases attenuation of the clock signal.

Turn-on circuit 44 operates to transmit the activation signal almost instantaneous with ramp up of the power supply (i.e., when ramp-up voltage achieves "on" threshold of transistor 60). Turn-on circuit 44 thereby operates at high speed to present an almost instantaneous (e.g., within a few nanoseconds) activation signal at the output of circuit 44 to the input of attenuator 50. Conversely, delay circuit 46 transmits a deactivation signal from the output of circuit 46 to attenuator 50 after a delay period has passed. Thus, clock conditioning circuit 42 almost instantaneously attenuates the clock signal but waits until after a delay period has passed before ceasing attenuation and allowing a clock signal to pass. Clock conditioning circuit 42 thereby operates to turn off the clock signal into CPU 20 during times in which the power supply is initially turned on. After the power supply has been on for a defined (delay) time period, i.e., after all transients, underdamped conditions or ringing of the power supply has ceased, clock conditioning circuit 42 discontinues attenuation and allows the clock signal entry into CPU 20. Clock conditioning circuit 42 thereby ensures that ramp-on transient conditions associated with initial activation of the power supply will not adversely affect CPU operation.

Figure 6:
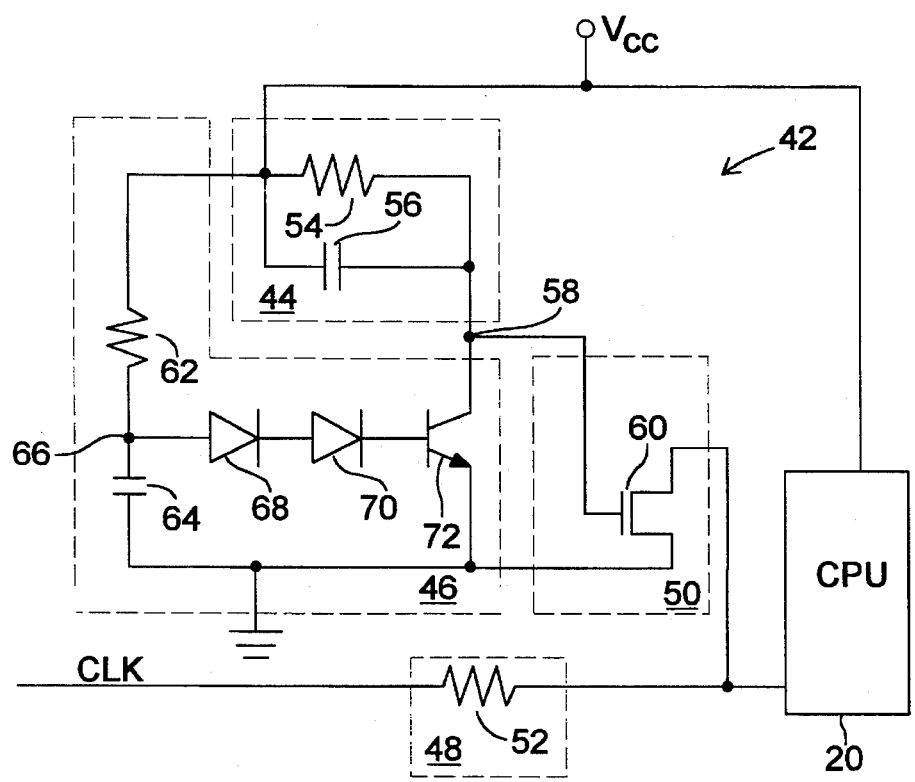
FIG. 6 is a clock conditioning circuit of the present invention.

Referring now to FIG. 6, clock conditioning circuit 42 is shown in circuit schematic. Circuit 42 includes a minimal number of active and passive devices. Applicant contemplates that the cost of the active and passive devices found within the present embodiment to be less than approximately $0.50 per circuit if purchased as discrete elements. However, if embodied directly upon the monolithic chip associated with CPU 20 and core logic 14, applicant postulates the area consumed to be less than several hundred microns square. Minimal added costs is of utmost importance when producing circuit 42 in large quantities on each and every CPU chip.

Of further importance, clock conditioning circuit does not utilize any active devices upon the clock signal conductor. The only device placed on the clock signal conductor for receiving a high speed clock signal is a passive damping device 48, preferably a single resistor 52. Resistor 52, a suitable size being 30 to 50 ohms, serves to damp the clock signal but maintains zero propagation delay, regardless of clock signal speed. If an active device, instead of a passive device, is placed between core logic 14 and CPU 20, then the active device and capacitive characteristics associated with that device will slow the clock signal or cause "rounding" of the clock edges—possibly resulting in false triggering of CPU 20. It is therefore advantageous to use a single passive device, i.e., a single resistive element with no associated capacitance.

Clock conditioning circuit 42 is shown to include turn-on circuit 44, delay circuit 46, damping device 48 and attenuator 50. Turn-on circuit 44 includes parallel-connected resistor 54 and capacitor 56. Suitable sizes for resistor 54 and capacitor 56 are, for example, 10K ohms and 0.001 micro farads. Resistor 54 and capacitor 56 are coupled in parallel. Resistor 54 presents a dc pass, while capacitor 56 presents a high speed ac pass (i.e., a high frequency pass or "high pass" filter). Initial variance, transients and ringing voltage changes of the power supply are presented to the high-pass filter as having a fairly high frequency, causing the voltage change to be quickly presented to node 58. The reactance of the high-pass filter is somewhat low and is inversely proportional to the transient frequency of the power supply ramp-up, as well as capacitor 56 value. According to the following equation:

$$X_c = 1/2\ \pi f C$$

A quick pass through of the power supply transients to node 58 are translated to attenuator 50. Attenuator 50 includes a metal oxide semiconductor (MOS) transistor 60. Transistor 60 includes a gate terminal coupled to node 58, a source terminal coupled to a ground potential and a drain terminal coupled to the conductor carrying the clock signal. Transistor 60 is an n-channel enhancement transistor. Once the voltage at node 58 exceeds a threshold (gate-to-source threshold) of transistor 60 which is generally in the range of 1.5 volts to 2.0 volts, then a conductive path between drain and source is formed, causing the clock signal to attenuate to ground potential. Attenuation thereby implies a low resistive conductive path between drain and source caused by a greater than threshold voltage at node 58. A greater than threshold voltage occurs whenever the power supply ramps upward from ground potential to an operational level (i.e., a gate-to-source threshold of transistor 60).

Node 58 maintains its positive voltage level during initial turn on of power supply. After a delay period, node 58 is coupled to ground using delay circuit 46. Delay circuit 46 includes a series-connected resistor 62 and capacitor 64. Suitable values for resistor 62 and capacitor 64 are 100K ohms and 1.0 micro farads, respectively. Series-connection of resistor 62 and capacitor 64 provides a low-pass filter of the power supply voltage at node 66. The low-pass configuration allows a delay charging of capacitor 64, and the amount of delay is proportional to the time constant (i.e., the product of resistor 62 and capacitor 64). Varying resistor 62 and capacitor 64 will present a variance in the time constant and the amount of delay associated with circuit 46.

Once capacitor 64 charges to a specified level (i.e., a level exceeding the turn-on threshold of the sum of diodes 68 and 70, as well as P-N junction of transistor 72) a delay period will have then passed. Assuming a 0.6 volt threshold for each diode 68 and 70, and 0.65 volt threshold for bipolar transistor 72, capacitor 64 must charge to a voltage value of approximately 1.85 volts in order to activate a low resistive path between the collector and emitter of transistor 72. Once activated, transistor 72 pulls down node 58 and discontinues attenuation of clock signal by turning off the conductive path of transistor 60. Delay circuit 46 thereby is used to turn off the attenuation circuit after a delay period, i.e., after capacitor 64 charges beyond a threshold amount. Capacitor 64 is clamped to the threshold sums defined above and allows transistor 72 base current to flow. The base current is limited by current limiting resistor 62. When transistor 72 turns on, collector current flows from the collector to the emitter causing the gate voltage of transistor 60 to change from the power supply voltage to less than 0.1 volts. This causes transistor 60 to turn off and allows the clock signal to directly drive CPU 20 phase-locked loop or one-shot via damping resistor 52.

Clock conditioning circuit provides zero propagation delay in the path between core logic 14 and CPU 20. Any voltage spikes or spurious ringing during initial turn-on of the power supply and associated with the clock signal are attenuated for a time delay period calculated as a product of resistor 62 and capacitor 64. Clock conditioning circuit advantageously uses very little energy. Assuming the values set forth above, and a power supply voltage maximum of 3.3 volts, the consumed power of circuit 42 is (3.3×3.3/10K), or approximately 1.0 mW.

It will be appreciated to those skilled in the art having the benefit of this disclosure that this invention is believed to be capable of applications with numerous types circuits, either discrete elements or circuits embodied within a monolithic semiconductor substrate. The clock conditioning circuit can therefore be separate from or part of the monolithic substrate on which the CPU and core logic are embodied. It is also to be understood that the form of the invention shown and described is to be taken as a presently preferred embodiment. Various modifications and changes may be made to each and every circuit element, such as the configuration, placement and values for the high and low-pass filters, as well as the attenuation transistor and turn-off transistor, all as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A clock conditioning circuit comprising:
    an attenuator having an input node and a conductive path responsive to the input node, said conductive path is connected between a clock signal and a ground potential;
    a turn-on circuit coupled between said attenuator input node and a positive voltage and, upon initial receipt of said positive voltage, said turn-on circuit is coupled to activate said conductive path; and
    a delay circuit coupled between said attenuator input node and said positive voltage and, after initial receipt of said positive voltage has expired, said delay circuit is coupled to deactivate said conductive path.

2. The clock conditioning circuit as recited in claim 1, wherein said conductive path comprises a path of variable resistance.

3. The clock conditioning circuit as recited in claim 2, wherein said variable resistance is maximum during deactivation of the conductive path.

4. The clock conditioning circuit as recited in claim 2, wherein said variable resistance is minimum during activation of the conductive path.

5. The clock conditioning circuit as recited in claim 1 wherein said turn-on circuit delivers an activation signal to said attenuator input node for an initial time period for which said positive voltage is active, said initial time period duration is inversely proportional to a RC time constant defined by said turn-on circuit.

6. The clock conditioning circuit as recited in claim 1, wherein said positive voltage initially comprises a transient voltage and subsequently comprises a steady state voltage.

7. The clock conditioning circuit as recited in claim 6, wherein said transient voltage activates said attenuator.

8. The clock conditioning circuit as recited in claim 6, wherein said steady state voltage activates said delay circuit.

9. A microprocessor clocking system comprising:
    a core logic circuit and a microprocessor embodied upon a single monolithic silicon substrate and connected by a clock signal sent from said core logic circuit to said microprocessor;
    an attenuator, a turn-on circuit and a delay circuit also embodied upon said single monolithic silicon substrate, said turn-on circuit and said delay circuit are coupled to receive a power supply voltage, said turn-on circuit passing an initial duration of said power supply voltage to said attenuator such that said attenuator attenuates said clock signal to a ground potential during said initial duration of said power supply voltage, and said delay circuit passing a subsequent duration of said power supply voltage to deactivate said attenuator; and
    a passive damping device coupled between said core logic circuit and said microprocessor to receive said clock signal and damp said clock signal with no propagation delay as the clock signal is sent from said core logic to said microprocessor during said subsequent duration of said power supply voltage.

10. The microprocessor clocking system as recited in claim 9, wherein said core logic comprises logic gates coupled to receive a clock sync signal and produce said clock signal synchronized with said clock sync signal.

11. The microprocessor clocking system as recited in claim 9, wherein said attenuator comprises an MOS transistor having a gate terminal, a drain terminal and a source terminal, said gate terminal is connected between said turn-on circuit and said delay circuit, said drain terminal is connected to said clock signal, and said source terminal is connected to said ground potential.

12. The microprocessor clocking system as recited in claim 11, wherein said source and drain terminals form a conductive path when activated by said turn-on circuit, and wherein said turn-on circuit activates said conductive path during said initial duration of the power supply voltage.

13. The microprocessor clocking system as recited in claim 9, wherein said turn-on circuit comprises a resistor and capacitor connected in parallel in a high frequency pass configuration between said power supply voltage and said attenuator as well as between said power supply voltage and said delay circuit.

14. The microprocessor clocking system as recited in claim 9, wherein said delay circuit comprises a resistor and capacitor connected in series in a low frequency pass configuration between said power supply voltage and said ground potential, said delay circuit further comprises a series-connected pair of diodes coupled between a base terminal of a bipolar transistor and an intermediate location between said resistor and capacitor, said bipolar transistor is configured having a collector terminal connected to said turn-on circuit and said attenuator and an emitter terminal connected to said ground potential.

15. A method for disconnecting a clock signal to a microprocessor only during initial activation of a power supply voltage used to form the clock signal, said method comprising the steps of:
    generating a clock signal from a core logic circuit during an initial period during which a power supply is first applied to said core logic circuit;
    intercepting said clock signal during said initial period and routing said clock signal to a ground potential;

generating said clock signal from said core logic circuit during a subsequent period after which said initial period has expired; and forwarding said clock signal during said subsequent period to a microprocessor.

16. The method as recited in claim 15, wherein said intercepting step comprises activating a conductive path between said clock signal and said ground potential, and wherein said forwarding step comprises deactivating said conductive path between said clock signal and said ground potential.

17. The method as recited in claim 15, wherein said clock signal generated during said initial period includes transient voltage spikes, and said clock signal generated during said subsequent period is absent said transient voltage spikes.

18. The method as recited in claim 15, wherein said initial period is defined by an RC time constant.

19. The method as recited in claim 15, wherein said subsequent period is defined by an RC time constant.

* * * * *